(12) United States Patent
Huang et al.

(10) Patent No.: US 11,804,493 B2
(45) Date of Patent: Oct. 31, 2023

(54) ARRAY SUBSTRATE, MANUFACTURING METHOD THEREOF, AND DISPLAY DEVICE

(71) Applicants: CHUZHOU HKC OPTOELECTRONICS TECHNOLOGY CO., LTD, Anhui (CN); HKC Corporation Limited, Guangdong (CN)

(72) Inventors: Shishuai Huang, Chuzhou (CN); Wei Li, Shenzhen (CN)

(73) Assignees: CHUZHOU HKC OPTOELECTRONICS TECHNOLOGY CO., LTD, Chuzhou (CN); HKC CORPORATION LIMITED, Shenzhen (CN)

(*) Notice: Subject to any disclaimer, the term of this patent is extended or adjusted under 35 U.S.C. 154(b) by 141 days.

(21) Appl. No.: 17/240,378

(22) Filed: Apr. 26, 2021

(65) Prior Publication Data
US 2022/0028896 A1   Jan. 27, 2022

(30) Foreign Application Priority Data
Jul. 27, 2020 (CN) .......................... 202010729432.1

(51) Int. Cl.
*H01L 27/12* (2006.01)

(52) U.S. Cl.
CPC .......... *H01L 27/124* (2013.01); *H01L 27/127* (2013.01)

(58) Field of Classification Search
CPC ................. H01L 27/124; H01L 27/127; G02F 1/136254
See application file for complete search history.

(56) References Cited

U.S. PATENT DOCUMENTS

2003/0117536 A1* 6/2003 Jeon .................. G02F 1/136286
349/40

* cited by examiner

*Primary Examiner* — James A Dudek
(74) *Attorney, Agent, or Firm* — Franklin & Associates International Inc; Matthew Lambrinos

(57) ABSTRACT

An array substrate, a manufacturing method thereof, and a display device are provided. The array substrate includes a display area and a non-display area in which a peripheral circuit is provided. The peripheral circuit includes a test area, a bonding area, and a cutting area. The test area is provided with a test signal line for providing a test signal. The bonding area is adjacent to the display area, and the bonding area and the test area are electrically connected through signal leads. The cutting area is disposed between the test area and the bonding area. After a cutting process is completed in the cutting area, a cutting opening is formed on each signal lead. A position of the cutting opening of at least one signal lead is different from positions of the cutting openings of other signal leads in height along an extending direction of the signal leads.

8 Claims, 2 Drawing Sheets

ARRAY SUBSTRATE, MANUFACTURING METHOD THEREOF, AND DISPLAY DEVICE

CROSS REFERENCE TO RELATED APPLICATIONS

This application claims the benefit of Chinese patent application No. 2020107294321, filed on Jul. 27, 2020, the entire contents of which is incorporated herein in its entirety.

TECHNICAL FIELD

The present disclosure relates to the technical field of liquid crystal display, and more particularly, to an array substrate, a manufacturing method thereof, and a display device.

BACKGROUND

In a manufacturing process of a display panel, a plurality of detection procedures need to be performed, and one important detection procedure is to perform a lighting test in a lighting manner before performing chip on film packaging. After the test is completed, it is necessary to disconnect signal leads between a shorting bar and a test signal line by laser cutting.

However, during laser cutting, metal debris may accumulate at the fracture position of the metal. Once the metal debris is accumulated too much, the problem of short circuit between two adjacent signal leads will occur, thereby causing an abnormal display of the panel and reducing the yield of the display panel.

SUMMARY

According to various embodiments of present disclosure, an array substrate, a manufacturing method thereof, and a display device are provided.

Embodiments of the present disclosure provide an array substrate including a display area and a non-display area. The non-display area is provided with a peripheral circuit therein. The peripheral circuit includes:

a test area provided with a test signal line configured to provide a test signal;

a bonding area adjacent to the display area, the bonding area and the test area being electrically connected through signal leads; and a cutting area disposed between the test area and the bonding area, wherein after a cutting process is completed in the cutting area, a cutting opening is formed on each of the signal leads, and a position of the cutting opening of at least one signal lead is different from positions of the cutting openings of other signal leads in height along an extending direction of the signal leads.

In an embodiment, in the cutting area, positions of cutting openings of two adjacent signal leads are different in height along the extending direction of the signal leads.

In an embodiment, the test area includes an odd data wiring and an even data wiring. The signal leads include first leads and second leads. The first leads and the second leads are alternately arranged. The odd data wiring and the bonding area are electrically connected through the first leads, and the even data wiring and the bonding area are electrically connected through the second leads. Positions of cutting openings of the first leads are the same in height along the extending direction of the signal leads, and positions of cutting openings of the second leads are the same in height along the extending direction of the signal leads.

In an embodiment, the positions of the cutting openings of the first leads are higher than the positions of the cutting openings of the second leads along the extending direction of the signal leads. Alternatively, the positions of the cutting openings of the first leads are lower than the positions of the cutting openings of the second leads along the extending direction of the signal leads.

In an embodiment, the first leads and the second leads are disposed in different layers.

In an embodiment, cutting depths of the cutting openings of the first leads are different from cutting depths of the cutting openings of the second leads.

Based on the same inventive concept, an embodiment of the present disclosure further provides a method of manufacturing an array substrate, including:

forming a plurality of array areas on a base substrate to obtain a backplane, each of the array areas comprising a display area and a non-display area, the non-display area being provided with a peripheral circuit therein, the peripheral circuit comprising a test area, a bonding area, and a cutting area, the test area being provided with a test signal line therein configured to provide a test signal, the bonding area being adjacent to the display area, the bonding area and the test area being electrically connected through signal leads, and the cutting area being disposed between the test area and the bonding area;

dividing the backplane into a plurality of the array substrates;

in a test phase, providing a test signal through the test area, the test area providing the test signal to the display area through the bonding area to test the display area; and after the test is completed, cutting the signal leads in the cutting area by a laser, and forming a cutting opening on each of the signal leads to disconnect a connection between the test area and the bonding area, wherein a position of a cut opening of at least one signal lead is different from positions of cut openings of other signal leads in height along the extending direction of the signal leads.

In an embodiment, the cutting the signal leads in the cutting area by the laser, and forming the cutting opening on each of the signal leads includes:

cutting the cutting line by a multiple laser cutting process, forming one cutting opening on each of the signal leads, and positions of cutting openings of two adjacent signal leads are different in height along the extending direction of the signal leads.

In an embodiment, the test area includes an odd data wiring and an even data wiring. The signal leads include first leads and second leads. The first leads and the second leads are alternately arranged. The odd data wiring and the bonding area are electrically connected through the first leads, and the even data wiring and the bonding area are electrically connected through the second leads. The cutting the signal leads in the cutting area by the laser includes:

aligning the laser to a cutting position of the first leads, and performing a laser cutting on the first leads by the laser, respectively, to disconnect a connection between the odd data wiring and the bonding area; and aligning the laser to a cutting position of the second leads, and performing a laser cutting on the second leads by the laser, respectively, to disconnect a connection between the even data wiring and the bonding area.

Based on the same inventive concept, an embodiment of the present disclosure further provides a display device including the array substrate according to any one of the above embodiments.

In summary, the embodiments of the present disclosure provide an array substrate, a manufacturing method thereof, and a display device. The array substrate includes the display area and the non-display area. The non-display area is provided with the peripheral circuit therein. The peripheral circuit includes a test area, a bonding area, and a cutting area. The test area is provided with the test signal line therein for providing the test signal. The bonding area is adjacent to the display area, and the bonding area and the test area are electrically connected through signal leads. The cutting area is disposed between the test area and the bonding area. After the cutting process is completed in the cutting area, a cutting opening is formed on each of the signal leads, and the position of the cutting opening of at least one signal lead is different from the positions of the cutting openings of other signal leads in height along the extending direction of the signal leads. In the present disclosure, since the position of the cutting opening of the at least one signal lead is different from the positions of the cutting openings of other signal leads in height along the extending direction of the signal leads, so that the distance between the cutting opening of the signal lead and the cutting opening of the adjacent signal lead is increased. That is, the distance between the metal debris at the cutting positions of the two adjacent signal leads is increased, and the possibility that the two adjacent signal leads are connected together through metal debris is reduced, thereby avoiding the problem of short circuit between the two adjacent signal leads caused by laser cutting, and improving the yield of the display panel.

The details of one or more embodiments of the disclosure are set forth in the accompanying drawings and the description below. Other features, objects, and advantages of the disclosure will be apparent from the description and drawings, and from the claims.

BRIEF DESCRIPTION OF THE DRAWINGS

To illustrate the technical solutions according to the embodiments of the present disclosure or in the prior art more clearly, the accompanying drawings for describing the embodiments or the prior art are introduced briefly in the following. Apparently, the accompanying drawings in the following description are only some embodiments of the present disclosure, and persons of ordinary skill in the art can derive other drawings from the accompanying drawings without creative efforts.

DETAILED DESCRIPTION OF THE EMBODIMENTS

In order to facilitate understanding of the present disclosure, the present disclosure will be described more fully below with reference to the accompanying drawings. Alternative embodiments of the present disclosure are given in the accompanying drawings. However, the present disclosure may be implemented in many different forms and is not limited to the embodiments described herein. Rather, the purpose of these embodiments is to make the disclosure of this application more thorough and complete.

Unless defined otherwise, all technical and scientific terms used herein have the same meaning as commonly understood by one of ordinary skill in the art to which this application belongs. The terminology used in the specification of this application is for the purpose of describing specific examples only and is not intended to limit the application. As used herein, the term "and/or" includes any and all combinations of one or more of the relevant listed items.

It should be noted that when an element is referred to as being "connected" or "coupled" to another element, it can be directly connected or coupled to the other element or intervening elements may be present.

Figure 1:
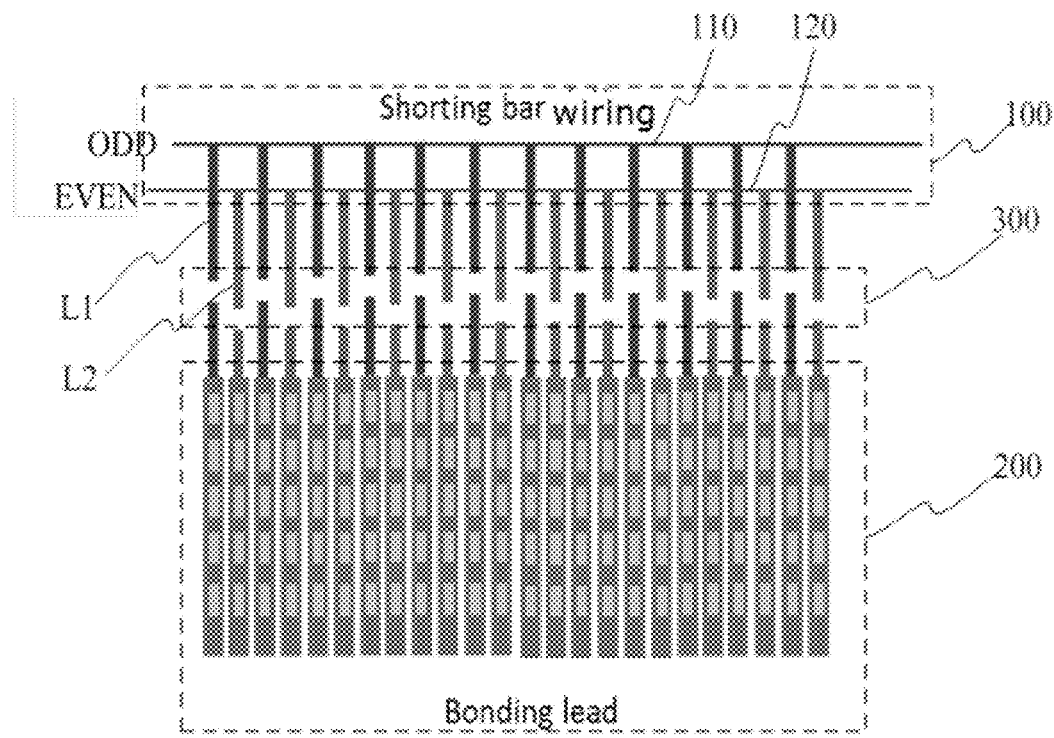
FIG. 1 is a schematic view of an array substrate according to an embodiment of the present disclosure.

Referring to FIG. 1, an embodiment of the present disclosure provides an array substrate including a display area and a non-display area. The non-display area is provided with a peripheral circuit therein. The peripheral circuit includes a test area 100, a bonding area 200, and a cutting area 300. The test area 100 is provided with a test signal line therein for providing a test signal. The bonding area 200 is adjacent to the display area, and the bonding area 200 and the test area 100 are electrically connected through signal leads. The cutting area 300 is disposed between the test area 100 and the bonding area 200. After the cutting process is completed in the cutting area 300, a cutting opening is formed on each of the signal leads, and the position of the cutting opening of at least one signal lead is different from the positions of the cutting openings of other signal leads in height along the extending direction of the signal leads.

Figure 2:
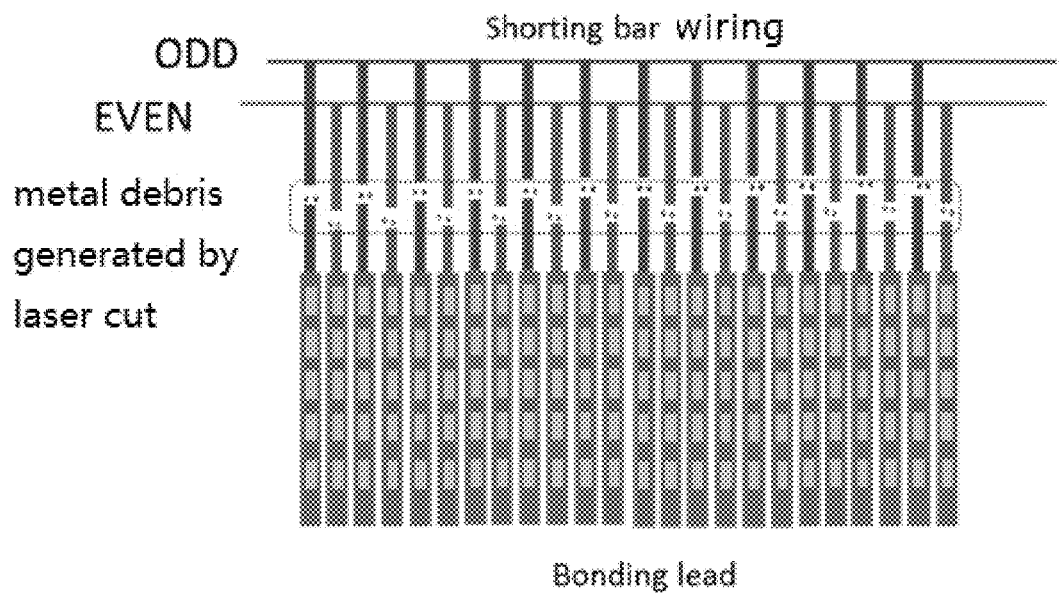
FIG. 2 is a schematic view of metal debris accumulation distribution in an array substrate according to an embodiment of the present disclosure.

It will be appreciated that after the test is completed, the signal leads need to be cut in the cutting area 300 by the laser, so that the connection between the test area 100 and the bonding area 200 is disconnected, and the data signal in the bonding area 200 is prevented from flowing backwards to the test area 100 after the test is completed. Referring to FIG. 2, in the present embodiment, since the position of the cutting opening of the at least one signal lead is different from the positions of the cutting openings of other signal leads in height along the extending direction of the signal leads, a distance between the cutting opening of the signal lead and the cutting opening of the adjacent signal lead is increased, so that the possibility that the two adjacent signal leads are connected together through metal debris is reduced, thereby avoiding the problem of short circuit between the two adjacent signal leads caused by laser cutting, and improving the yield of the display panel.

In an embodiment, in the cutting area 300, the positions of the cutting openings of the two adjacent signal leads are different in height along an extending direction of the signal leads. In the present embodiment, the positions of the cutting openings of any two adjacent signal leads are different from each other in height along the extending direction of the signal leads, so that the possibility that the metal debris at the cutting positions of any two adjacent signal leads are connected together is reduced, the problem of short circuit between the two adjacent signal leads caused by laser cutting is avoided to the greatest extent, and the yield of the display panel is further improved.

In an embodiment, the test area 100 includes an odd data wiring 110 and an even data wiring 120. The signal leads include first leads L1 and second leads L2, and the first leads L1 and the second leads L2 are alternately arranged. The odd data wiring 110 and the bonding area 200 are electrically connected through the first leads L1, and the even data wiring 120 and the bonding area 200 are electrically connected through the second leads L2. In addition, the positions of the cutting openings of the plurality of first leads L1 are the same in height along the extending direction of the signal leads, and the positions of the cutting openings of the plurality of second leads L2 are the same in height along the extending direction of the signal leads.

It will be appreciated that prior to the laser cutting, the laser needs to be aligned to the cutting position, and if heights of the cutting openings of the plurality of signal leads are not the same along the extending direction of the signal leads, the laser needs to be re-aligned to another cutting position after each signal lead is cut, which takes a considerable amount of time. In this embodiment, since the positions of the cutting openings of the plurality of first leads L1 are the same in height along the extending direction of the signal leads and the positions of the cutting openings of the plurality of second leads L2 are the same in height along the extending direction of the signal leads, the process of aligning the laser to the cutting position only needs to be repeated once, thereby shortening the time required for laser cutting. Moreover, since the first leads L1 and the second leads L2 are alternately arranged, the cutting positions of each adjacent two signal leads are different from each other in height along the extending direction of the signal leads, so that the possibility that the metal debris at the cutting positions of any adjacent two signal leads are connected together is reduced, and the problem of short circuit between the adjacent two signal leads caused by the laser cutting is avoided to the greatest extent.

In an embodiment, the positions of the cutting openings of the first leads L1 are higher than the positions of the cutting openings of the second leads L2 along the extending direction of the signal leads. Alternatively, the positions of the cutting openings of the first leads L1 are lower than the positions of the cutting openings of the second leads L2 along the extending direction of the signal leads. It will be appreciated that since the first leads L1 and the second leads L2 are alternately arranged, whether the positions of the cutting openings of the first leads L1 are higher than the positions of the cutting openings of the second leads L2 or the positions of the cutting openings of the first leads L1 are lower than the positions of the cutting openings of the second leads L2 along the extending direction of the signal leads, the distance between the cutting openings of two adjacent signal leads can be increased, thereby avoiding the short circuit of the two adjacent signal leads at the cutting area 300 due to the accumulation of metal debris.

In an embodiment, the first leads L1 and the second leads L2 are disposed in different layers. It will be appreciated that in order to avoid the crossing of the first leads L1 with the even data wiring 120, or the crossing of the second leads L2 with the odd data wiring 110, during the manufacturing of the array substrate, the first leads L1 and the odd data wiring 110 are disposed in the same layer, the second leads L2 and the even data wiring 120 are disposed in the same layer, and the first leads L1 and the second leads L2 are located on different layers. Since the first leads L1 and the second leads L2 are located on different layers, for example, when the first leads L1 are closer to a surface than the second leads L2, all the first leads L1 can be cut by using one laser cutting process, the cutting parameters of the laser do not need to be adjusted, and the second leads L2 are not cut, which is advantageous for reducing the adjustment times of the laser and reducing the complexity of the laser cutting.

In an embodiment, cutting depths of the cutting positions of the first leads L1 are different from cutting depths of the cutting positions of the second leads L2. It will be appreciated that in order to avoid the crossing of the first leads L1 with the even data wiring 120, or the crossing of the second leads L2 with the odd data wiring 110, the first leads L1 and the second leads L2 are disposed in different layers during the manufacturing of the array substrate. Therefore, in order to connect or disconnect the first leads L1 and connect or disconnect the second leads L2, the cutting depths of the cutting positions of the first leads L1 are different from the cutting depths of the cutting positions of the second leads L2.

Figure 3:
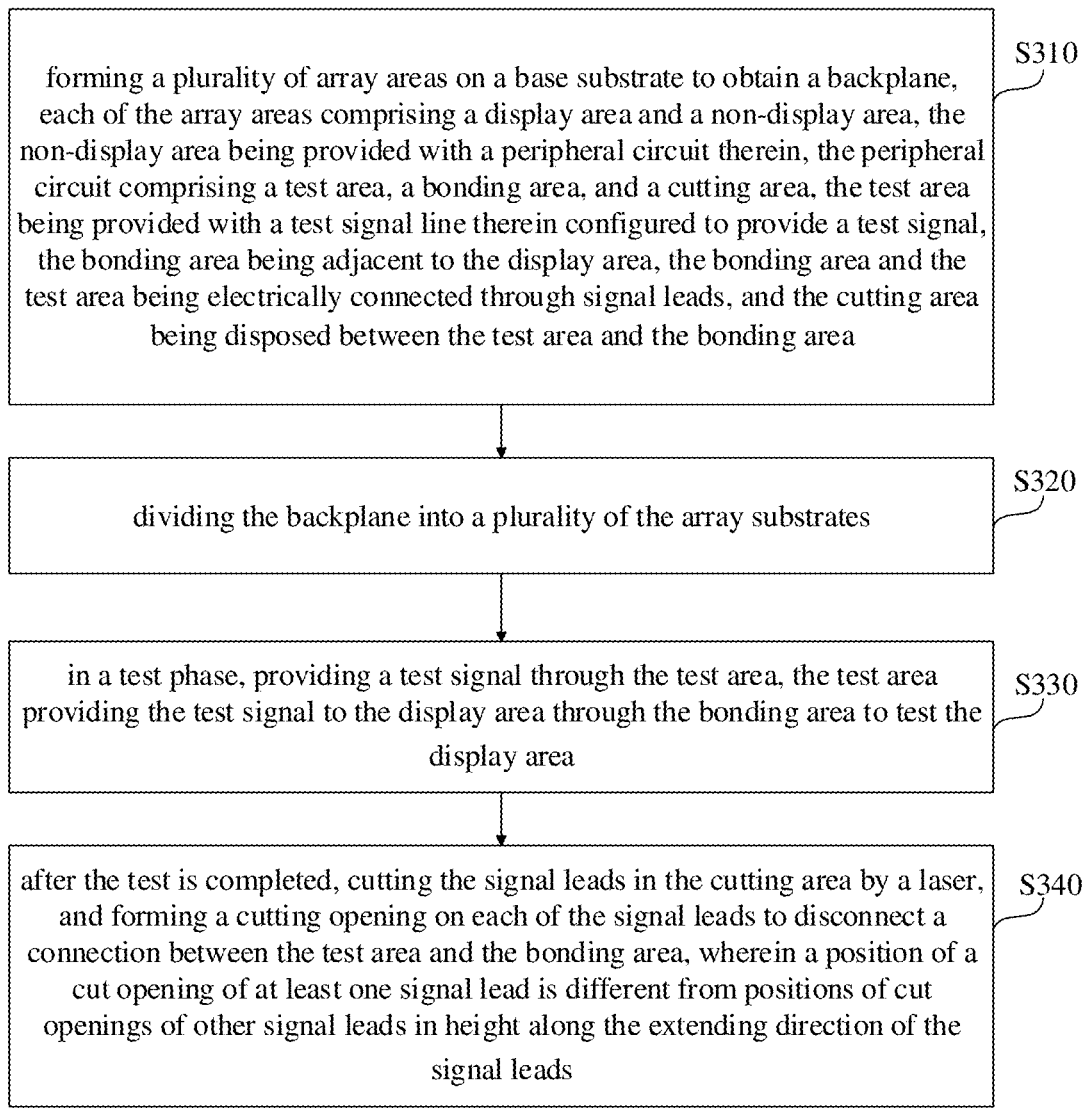
FIG. 3 is a flow chart of a method of manufacturing an array substrate according to an embodiment of the present disclosure.

Referring to FIG. 3, based on the same inventive concept, an embodiment of the present disclosure further provides a method of manufacturing an array substrate, including the following steps.

At step S310, a plurality of array areas are formed on a base substrate to obtain a backplane. Each of the array areas includes a display area and a non-display area. The non-display area is provided with a peripheral circuit therein. The peripheral circuit includes a test area 100, a bonding area 200, and a cutting area 300. The test area 100 is provided with a test signal line therein for providing a test signal. The bonding area 200 is adjacent to the display area, and the bonding area 200 and the test area 100 are electrically connected through signal leads. The cutting area 300 is disposed between the test area 100 and the bonding area 200.

At step S320, the backplane is divided into a plurality of the array substrates.

At step S330, in a test phase, a test signal is provided through the test area 100, and the test area 100 provides the test signal to the display area through the bonding area 200 to test the display area.

At step S340, after the test is completed, the signal leads are cut in the cutting area 300 by a laser, and a cutting opening is formed on each of the signal leads to disconnect a connection between the test area 100 and the bonding area 200. A cutting position of at least one signal lead is different from positions of the cutting openings of other signal leads in height along the extending direction of the signal leads.

In this embodiment, after the test is completed, the signal leads need to be cut in the cutting area 300 by the laser, so that the connection between the test area 100 and the bonding area 200 is disconnected, and the data signal in the bonding area 200 is prevented from flowing backwards to the test area 100 after the test is completed. In the present embodiment, since the position of the cutting opening of the at least one signal lead is different from the positions of the cutting openings of other signal leads in height along the extending direction of the signal leads, a distance between the cutting opening of the signal lead and the cutting opening of the adjacent signal lead is increased, so that the possibility that the two adjacent signal leads are connected together through metal debris is reduced, thereby avoiding the problem of short circuit between the two adjacent signal leads caused by laser cutting, and improving the yield of the display panel.

In an embodiment, the cutting the signal leads in the cutting area by the laser, and forming the cutting opening on each of the signal leads includes the followings.

The cutting line is cut by a multiple laser cutting process, a cutting opening is formed on each of the signal leads, and the positions of the cutting openings of the two adjacent signal leads are different in height along the extending direction of the signal leads. It will be appreciated that the cutting positions of any two adjacent signal leads are different from each other in height along the extending direction of the signal leads, so that the possibility that the metal debris at the cutting positions of any two adjacent signal leads are connected together is reduced, the problem of short circuit between the two adjacent signal leads caused by laser cutting is avoided to the greatest extent, and the yield of the display panel is further improved.

In an embodiment, the test area 100 includes an odd data wiring 110 and an even data wiring 120. The signal leads include first leads L1 and second leads L2, and the first leads L1 and the second leads L2 are alternately arranged. The odd data wiring 110 and the bonding area 200 are electrically connected through the first leads L1, and the even data wiring 120 and the bonding area 200 are electrically connected through the second leads L2. The cutting the signal leads in the cutting area by the laser includes:

Aligning the laser to the cutting position of the first leads L1, performing a laser cutting on the plurality of first leads L1 by laser, respectively, to disconnect a connection between the odd data wiring 110 and the bonding area 200; and Aligning the laser to the cutting position of the second leads L2, performing a laser cutting on the plurality of second leads L2 by laser, respectively, to disconnect a connection between the even data wiring 120 and the bonding area 200.

It will be appreciated that prior to the laser cutting, the laser needs to be aligned to the cutting position, and if cutting heights of the plurality of signal leads are not the same along the extending direction of the signal leads, the laser needs to be re-aligned to another cutting position after each signal lead is cut, which takes a considerable amount of time. In this embodiment, since the positions of the cutting openings of the plurality of first leads L1 are the same in height and the positions of the cutting openings of the plurality of second leads L2 are the same in height along the extending direction of the signal leads, the process of aligning the laser to the cutting position only needs to be repeated once, thereby shortening the time required for laser cutting. Moreover, since the first leads L1 and the second leads L2 are alternately arranged, the cutting positions of each adjacent two signal leads are different from each other in height along the extending direction of the signal leads, so that the possibility that the metal debris at the cutting positions of any adjacent two signal leads are connected together is reduced, and the problem of short circuit between the adjacent two signal leads caused by the laser cutting is avoided to the greatest extent.

In an embodiment, the positions of the cutting openings of the first leads L1 are higher than the positions of the cutting openings of the second leads L2 along the extending direction of the signal leads. Alternatively, the positions of the cutting openings of the first leads L1 are lower than the positions of the cutting openings of the second leads L2 along the extending direction of the signal leads. In the present embodiment, since the first leads L1 and the second leads L2 are alternately arranged, whether the positions of the cutting openings of the first leads L1 are higher than the positions of the cutting openings of the second leads L2 or the positions of the cutting openings of the first leads L1 are lower than the positions of the cutting openings of the second leads L2 along the extending direction of the signal leads, the distance between the cutting openings of two adjacent signal leads can be increased, thereby avoiding the short circuit of the two adjacent signal leads at the cutting area 300 due to the accumulation of metal debris.

In an embodiment, the first leads L1 and the second leads L2 are disposed in different layers. It will be appreciated that in order to avoid the crossing of the first leads L1 with the even data wiring 120, or the crossing of the second leads L2 with the odd data wiring 110, during the manufacturing of the array substrate, the first leads L1 and the odd data wiring 110 are disposed in the same layer, the second leads L2 and the even data wiring 120 are disposed in the same layer, and the first leads L1 and the second leads L2 are located on different layers. Since the first leads L1 and the second leads L2 are located on different layers, for example, when the first leads L1 are closer to the surface than the second leads L2, all the first leads L1 can be cut by using one laser cutting process, the cutting parameters of the laser do not need to be adjusted, and the second leads L2 are not cut, which is advantageous for reducing the adjustment times of the laser and reducing the complexity of the laser cutting.

Based on the same inventive concept, an embodiment of the present disclosure further provides a display device including the array substrate according to any one of the above embodiments. The display device may be any product or component having a display function, such as a liquid crystal panel, an electronic paper, an organic light emitting diode (OLED) panel, a mobile phone, a tablet computer, a television, a display, a notebook computer, a digital photo frame, or a navigator and the like.

In summary, the embodiments of the present disclosure provide an array substrate, a manufacturing method thereof, and a display device. The array substrate includes the display area and the non-display area. The non-display area is provided with the peripheral circuit therein. The peripheral circuit includes a test area 100, a bonding area 200, and a cutting area 300. The test area 100 is provided with the test signal line therein for providing the test signal. The bonding area 200 is adjacent to the display area, and the bonding area 200 and the test area 100 are electrically connected through signal leads. The cutting area 300 is disposed between the test area 100 and the bonding area 200. After the cutting process is completed in the cutting area 300, a cutting opening is formed on each of the signal leads, and the position of the cutting opening of at least one signal lead is different from the positions of the cutting openings of other signal leads in height along the extending direction of the signal leads. In the present disclosure, since the position of the cutting opening of the at least one signal lead is different from the positions of the cutting openings of other signal leads in height along the extending direction of the signal leads, so that the distance between the cutting opening of the signal lead and the cutting opening of the adjacent signal lead is increased. That is, the distance between the metal debris at the cutting positions of the two adjacent signal leads is increased, and the possibility that the two adjacent signal leads are connected together through metal debris is reduced, thereby avoiding the problem of short circuit between the two adjacent signal leads caused by laser cutting, and improving the yield of the display panel.

Although the respective embodiments have been described one by one, it shall be appreciated that the respective embodiments will not be isolated. Those skilled in the art can apparently appreciate upon reading the disclosure of this application that the respective technical features involved in the respective embodiments can be combined arbitrarily between the respective embodiments as long as they have no collision with each other. Of course, the respective technical features mentioned in the same embodiment can also be combined arbitrarily as long as they have no collision with each other.

The foregoing descriptions are merely specific embodiments of the present disclosure, but are not intended to limit the protection scope of the present disclosure. Any variation or replacement readily figured out by a person skilled in the art within the technical scope disclosed in the present disclosure shall all fall within the protection scope of the present disclosure. Therefore, the protection scope of the present disclosure shall be subject to the protection scope of the appended claims.

What is claimed is:

1. An array substrate, comprising a display area and a non-display area, the non-display area being provided with a peripheral circuit therein, the peripheral circuit comprising:
    a test area provided with a test signal line configured to provide a test signal;
    a bonding area adjacent to the display area, the bonding area and the test area being electrically connected through signal leads; and
    a cutting area disposed between the test area and the bonding area, wherein after a cutting process is completed in the cutting area, a cutting opening is formed on each of the signal leads, and a position of the cutting opening of at least one signal lead is different from positions of the cutting openings of other signal leads in height along an extending direction of the signal leads;
    wherein in the cutting area, positions of cutting openings of two adjacent signal leads are different in height along the extending direction of the signal leads.

2. The array substrate according to claim 1, wherein the test area comprises an odd data wiring and an even data wiring, the signal leads comprise first leads and second leads, the first leads and the second leads are alternately arranged, the odd data wiring and the bonding area are electrically connected through the first leads, the even data wiring and the bonding area are electrically connected through the second leads, positions of cutting openings of the first leads are the same in height along the extending direction of the signal leads, and positions of cutting openings of the second leads are the same in height along the extending direction of the signal leads.

3. The array substrate according to claim 2, wherein the positions of the cutting openings of the first leads are higher than the positions of the cutting openings of the second leads along the extending direction of the signal leads.

4. The array substrate according to claim 2, wherein the positions of the cutting openings of the first leads are lower than the positions of the cutting openings of the second leads along the extending direction of the signal leads.

5. The array substrate of claim 2, wherein the first leads and the second leads are disposed in different layers.

6. The array substrate of claim 5, wherein the first leads and the odd data wiring are disposed in the same layer, and the second leads and the even data wiring are disposed in the same layer.

7. The array substrate according to claim 5, wherein cutting depths of the cutting openings of the first leads are different from cutting depths of the cutting openings of the second leads.

8. A display device comprising the array substrate of claim 1.

* * * * *